United States Patent [19]

Gibbs et al.

[11] Patent Number: 5,463,642
[45] Date of Patent: Oct. 31, 1995

[54] METHOD AND APPARATUS FOR DETERMINING ERROR LOCATION

[75] Inventors: Vickie L. Gibbs; Rom-Shen Kao, both of Durham, N.C.

[73] Assignee: Mitsubishi Semiconductor America, Inc., Durham, N.C.

[21] Appl. No.: 82,867

[22] Filed: Jun. 29, 1993

[51] Int. Cl.$^6$ .................................................. H03M 13/00
[52] U.S. Cl. ...................... 371/40.1; 371/39.1; 371/38.1
[58] Field of Search ....................................... 371/37.1–42

[56] References Cited

U.S. PATENT DOCUMENTS

| | | | |
|---|---|---|---|
| 4,584,686 | 4/1986 | Fritze | 371/37 |
| 4,841,300 | 6/1989 | Yoshida et al. | 371/37 |
| 4,875,211 | 10/1989 | Murai et al. | 371/40.1 |
| 4,899,341 | 2/1990 | Tomimitsu | 371/37.6 |
| 5,020,060 | 5/1991 | Murai et al. | 371/37.1 |
| 5,136,592 | 8/1992 | Weng | 371/39.1 |
| 5,170,399 | 12/1992 | Cameron et al. | 371/37.1 |

*Primary Examiner*—James P. Trammell
*Attorney, Agent, or Firm*—Lowe, Price, LeBlanc & Becker

[57] ABSTRACT

A circuit for determining locations of the errors that occur during data storage tests each possible error location using an error location polynomial. Accumulating registers of a set of multiplier accumulators are loaded with the components of the error location polynomial at the start of each 120-byte word to be tested. The output signals of the accumulating registers are transferred to an XOR checksum circuit. If the output of the XOR checksum circuit is determined to be zero, the current byte of the tested word is considered to be an error location. An external clock signal corresponding to the consecutive bytes to be tested saves the outputs of the unary multipliers for multiplying by the Galois field elements $\alpha^{123}$–$\alpha^{131}$, through a feedback loop to the multiplier accumulating registers.

15 Claims, 20 Drawing Sheets

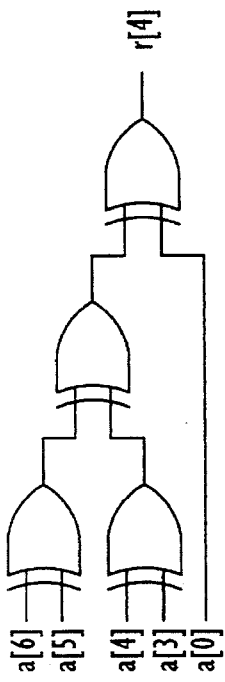
FIG. 4E
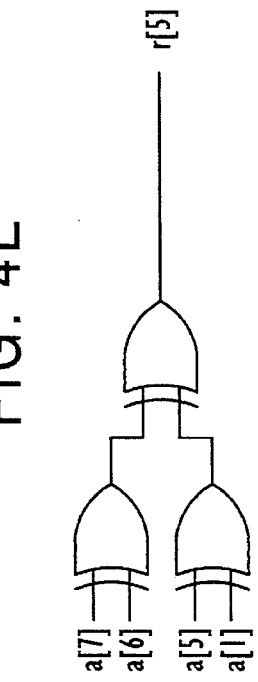
FIG. 4F
FIG. 4G
FIG. 4H
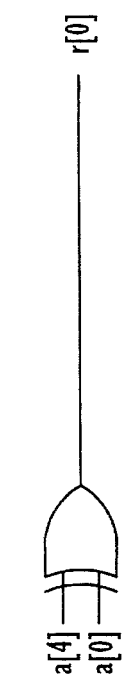
FIG. 4A
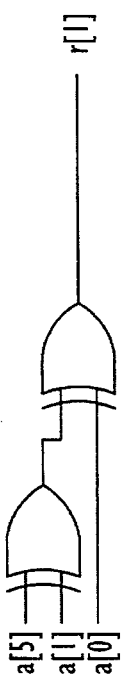
FIG. 4B
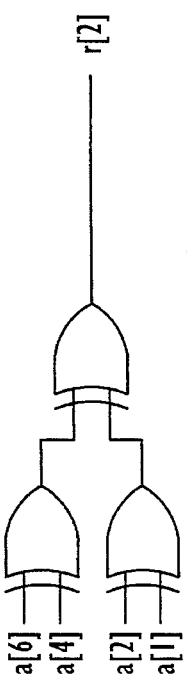
FIG. 4C
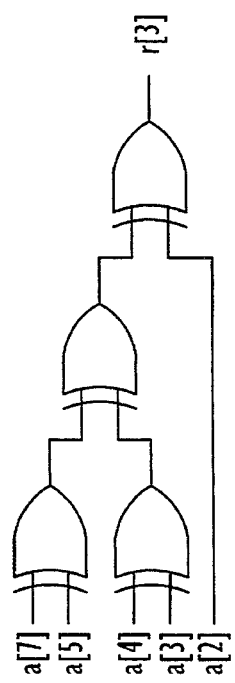
FIG. 4D

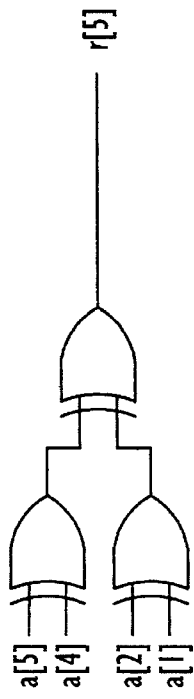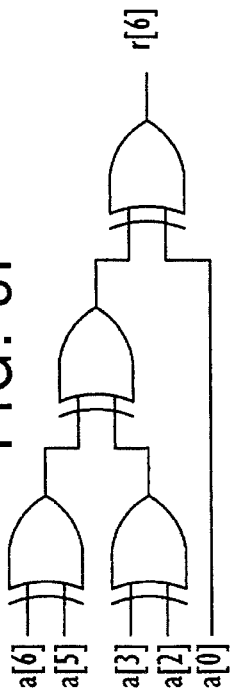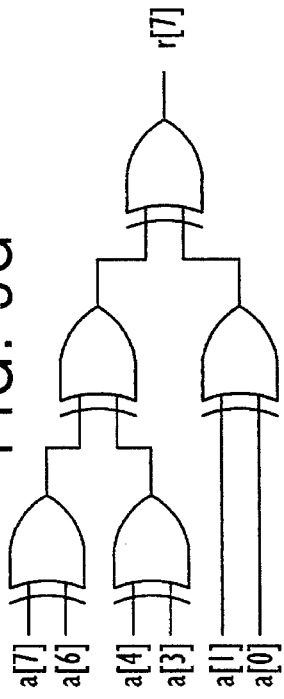
FIG. 5E  FIG. 5F  FIG. 5G  FIG. 5H
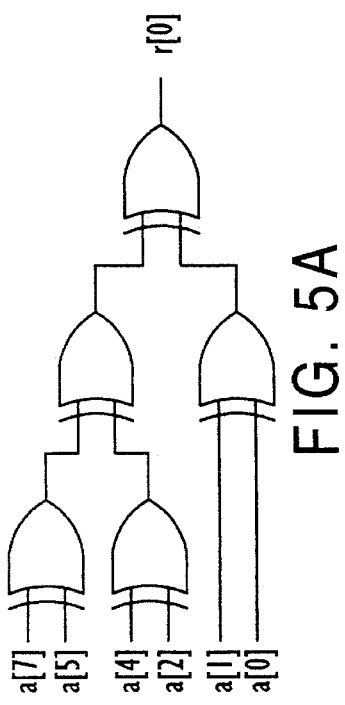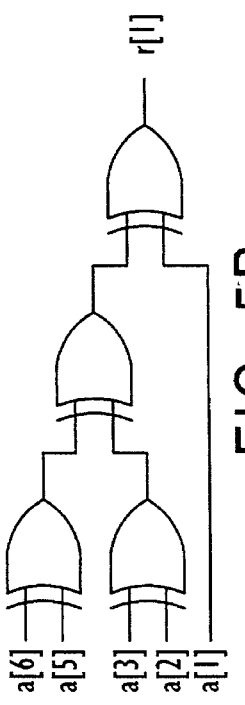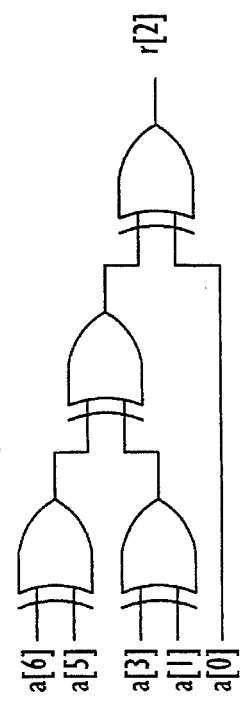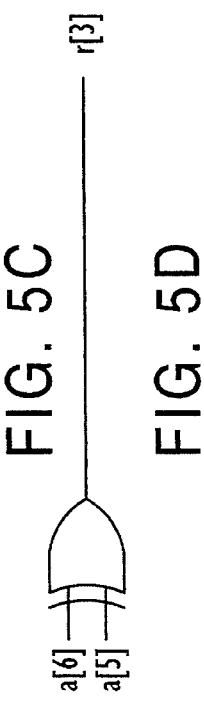
FIG. 5A  FIG. 5B  FIG. 5C  FIG. 5D

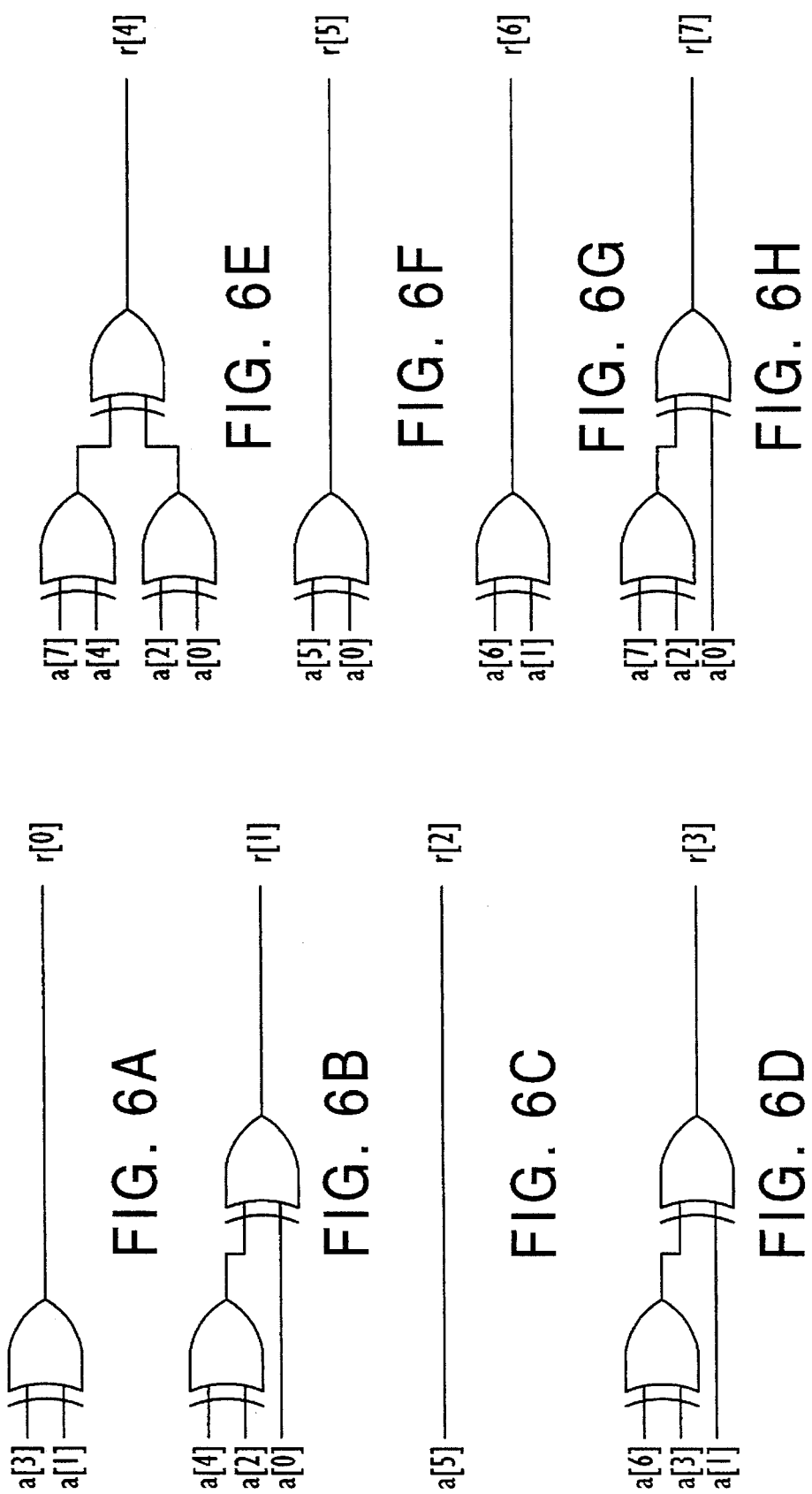

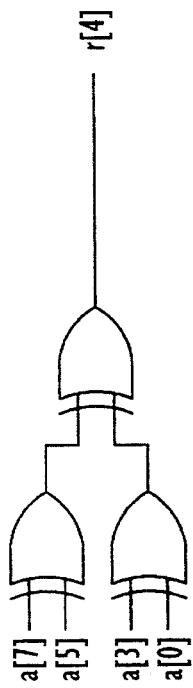
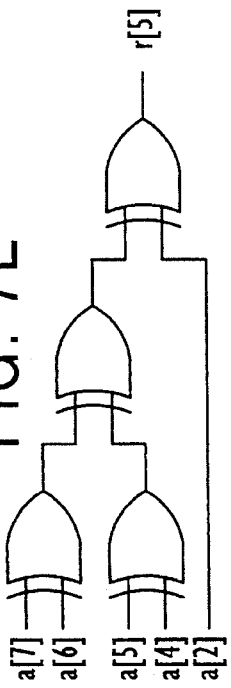
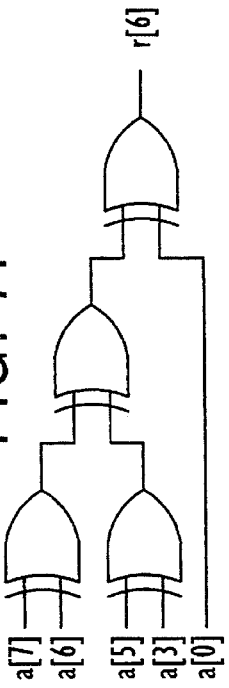
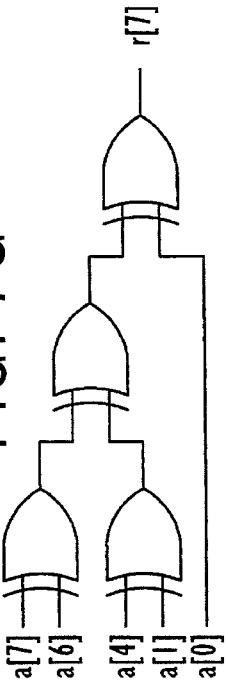
FIG. 7E  FIG. 7F  FIG. 7G  FIG. 7H
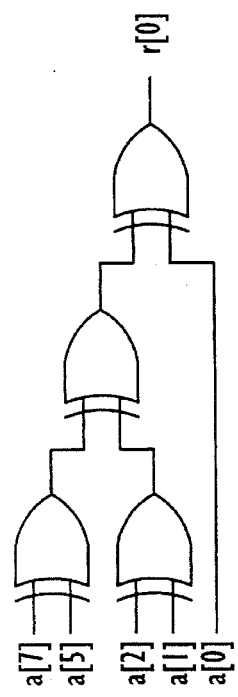
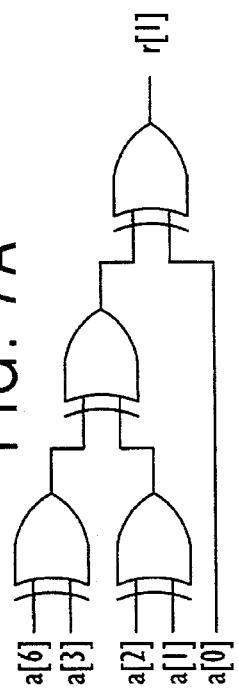
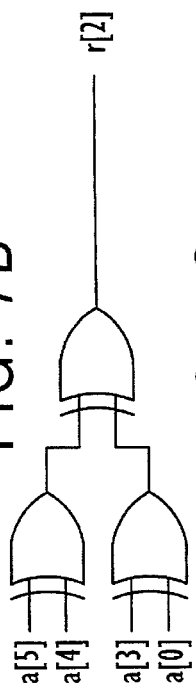
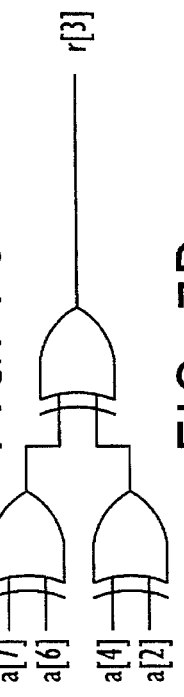
FIG. 7A  FIG. 7B  FIG. 7C  FIG. 7D

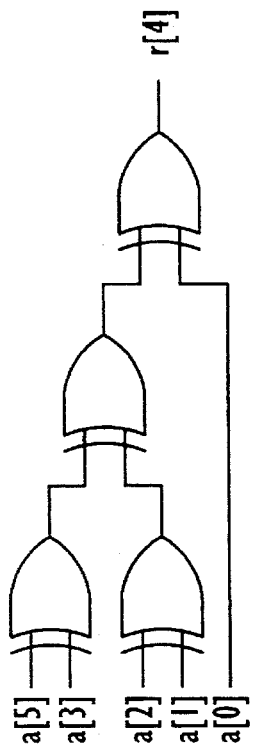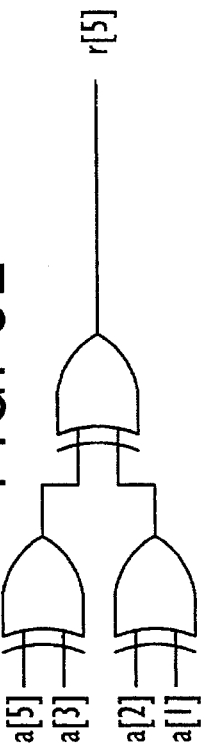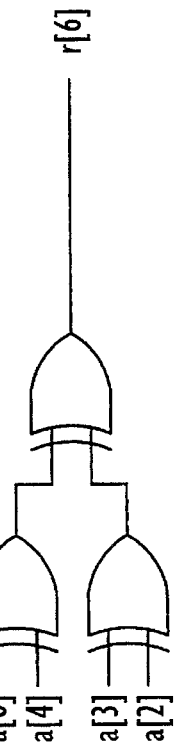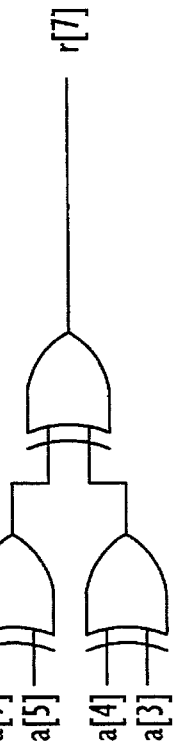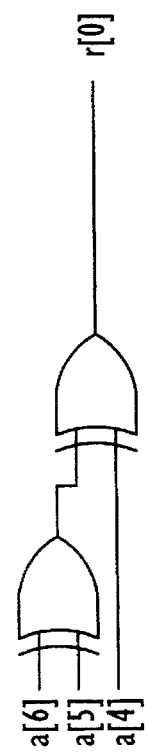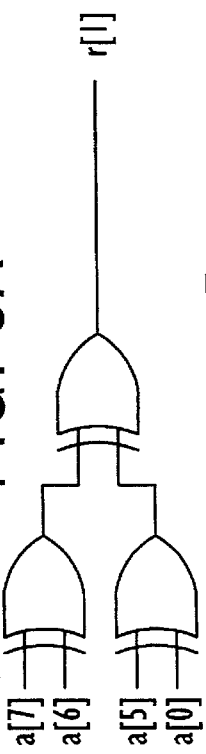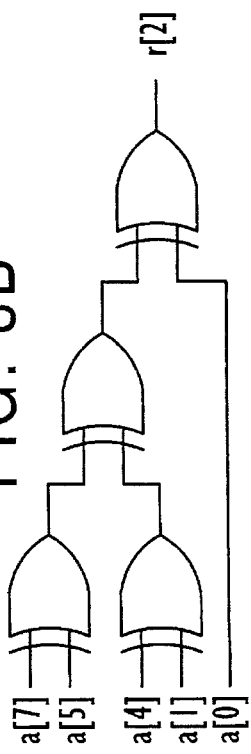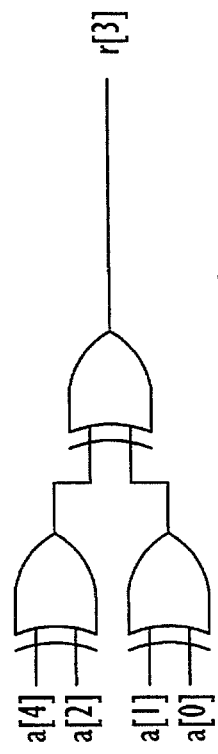

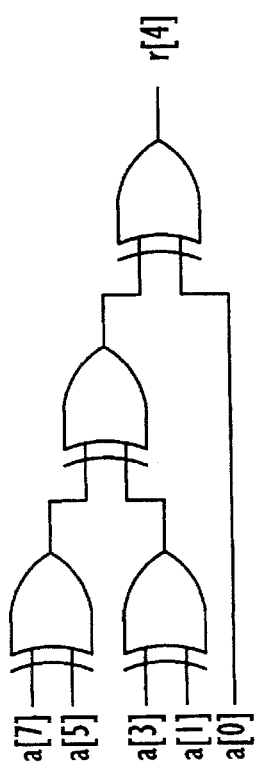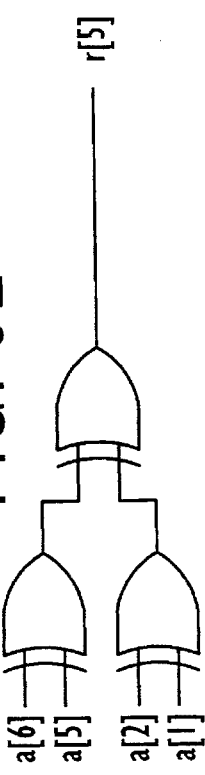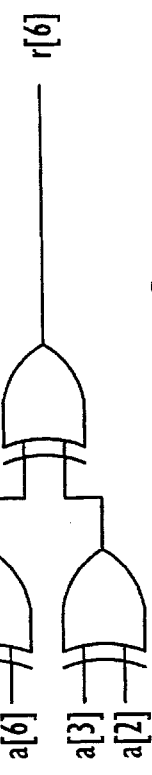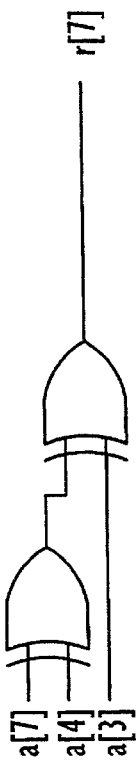
FIG. 9E  FIG. 9F  FIG. 9G  FIG. 9H
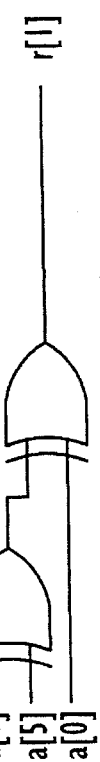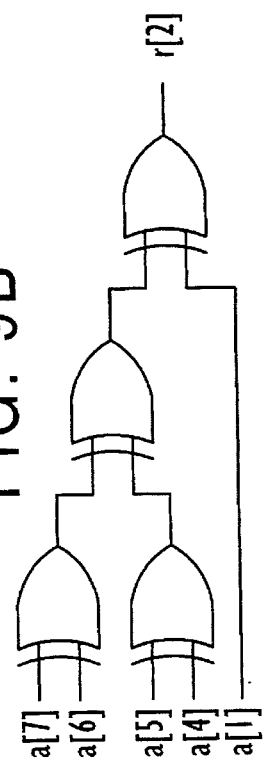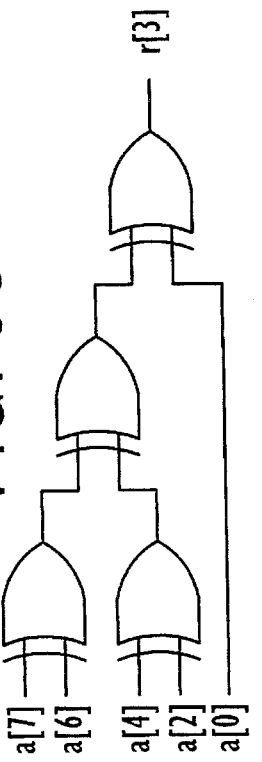
FIG. 9A  FIG. 9B  FIG. 9C  FIG. 9D

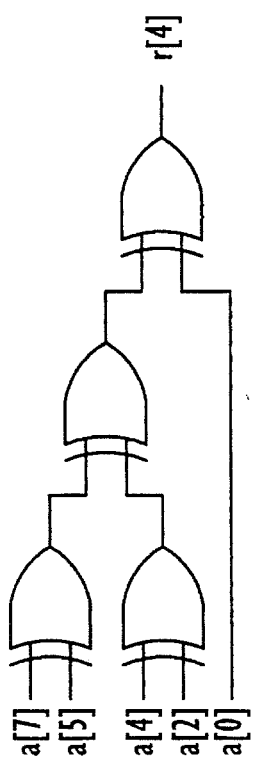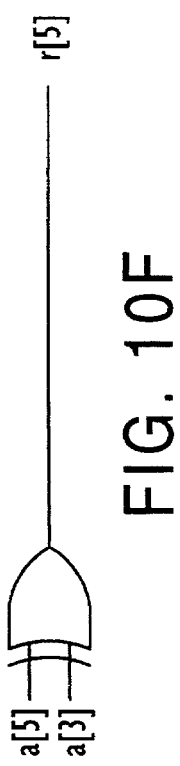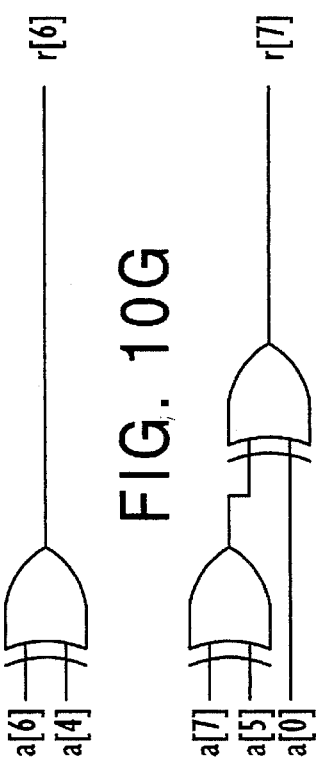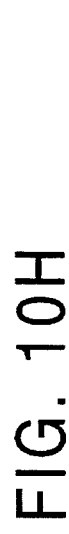
FIG. 10E  FIG. 10F  FIG. 10G  FIG. 10H
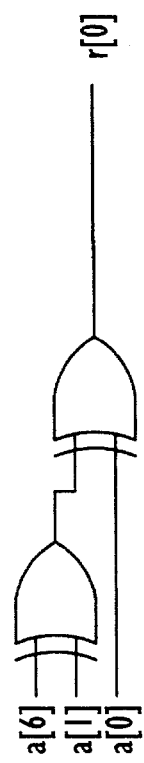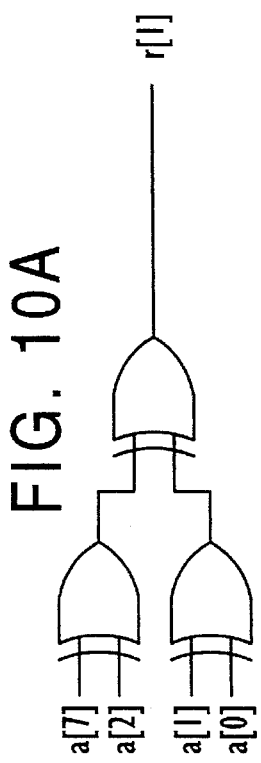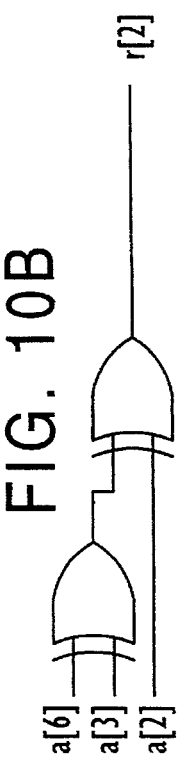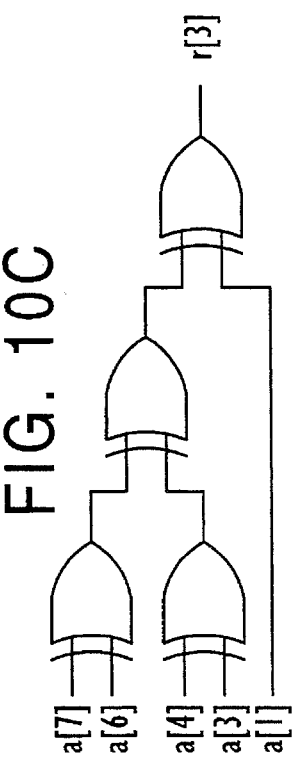
FIG. 10A  FIG. 10B  FIG. 10C  FIG. 10D

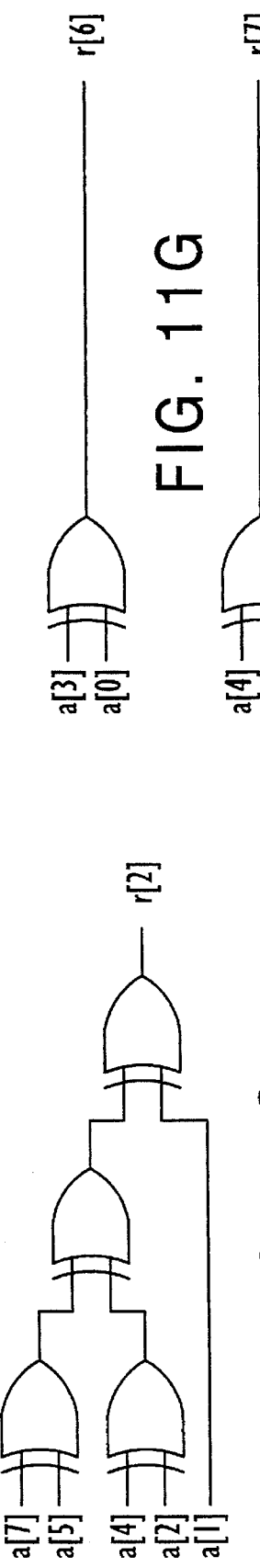
FIG. 11A  FIG. 11B  FIG. 11C  FIG. 11D  FIG. 11E  FIG. 11F  FIG. 11G  FIG. 11H

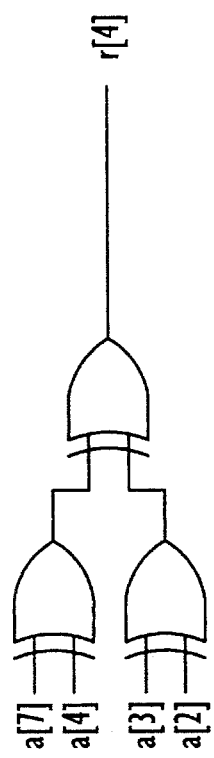
FIG. 12E
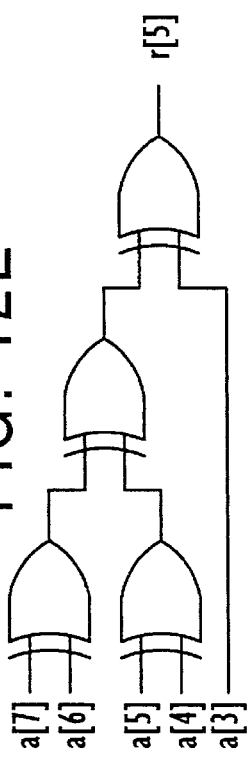
FIG. 12F
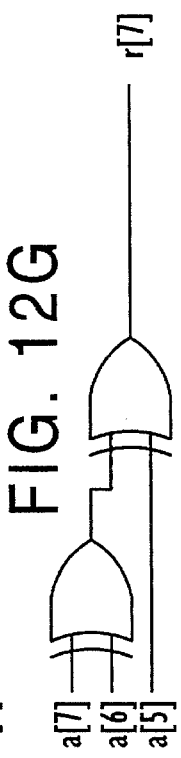

FIG. 12H
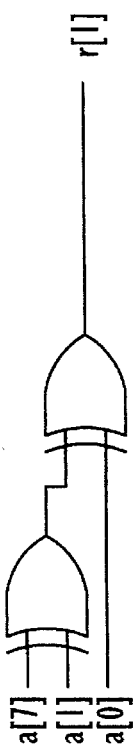
FIG. 12A
FIG. 12B
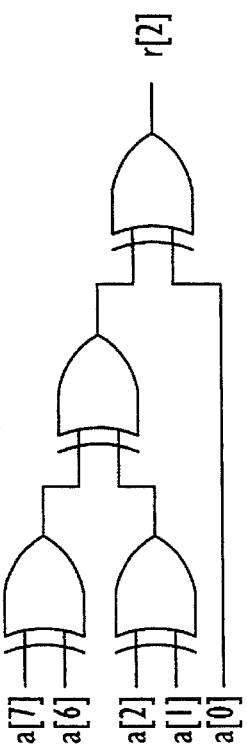
FIG. 12C
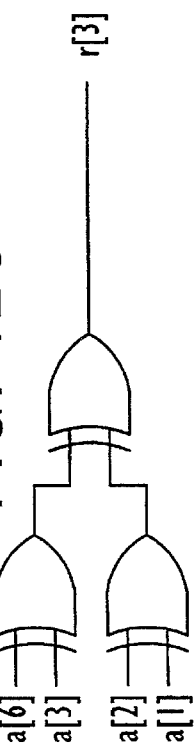
FIG. 12D

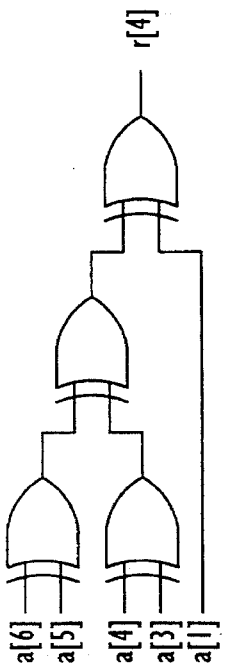 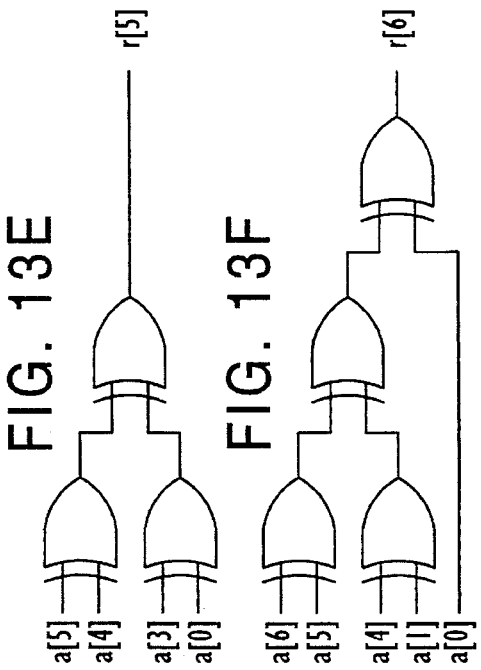 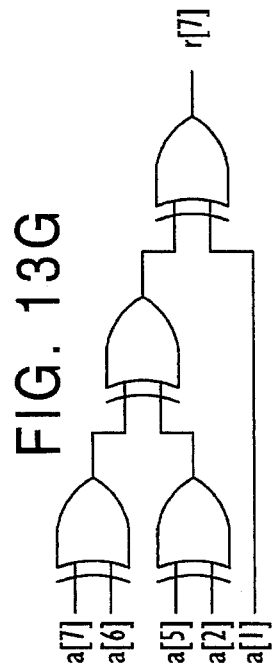
FIG. 13E  FIG. 13F  FIG. 13G  FIG. 13H
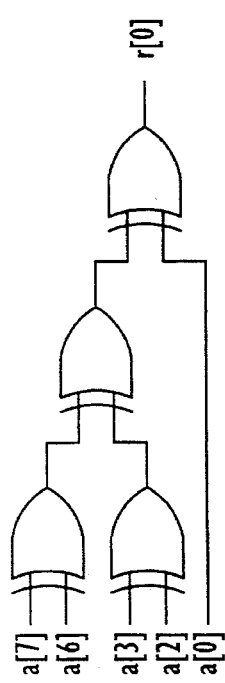 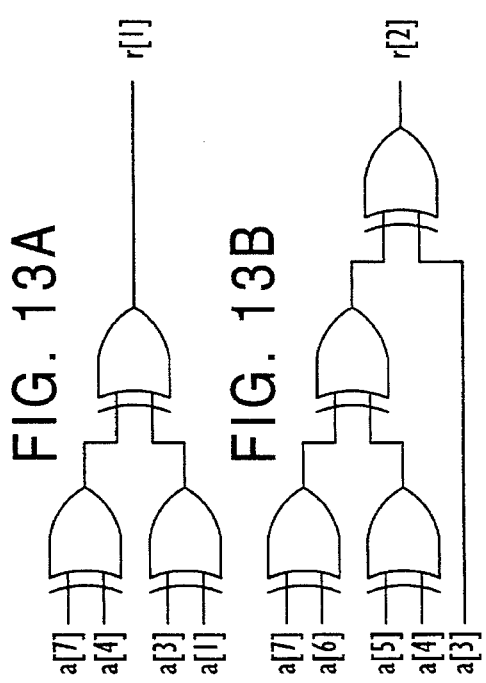 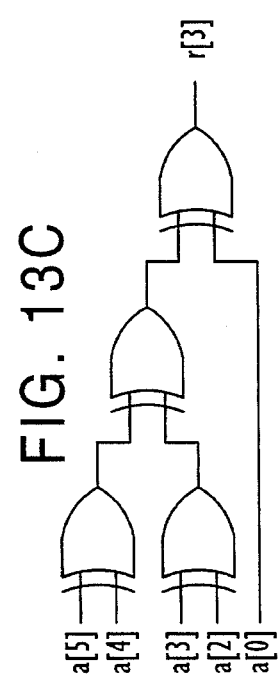
FIG. 13A  FIG. 13B  FIG. 13C  FIG. 13D

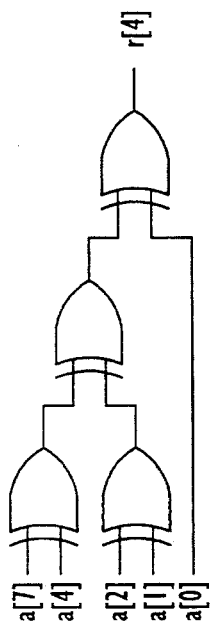
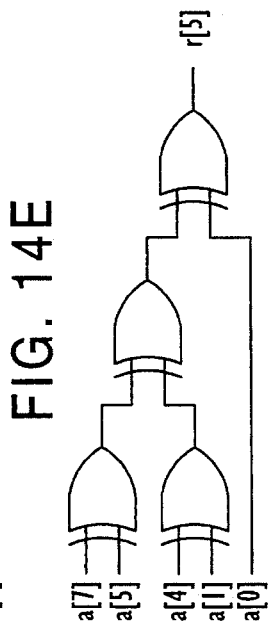
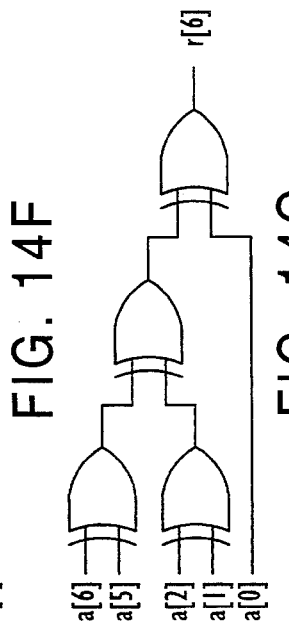
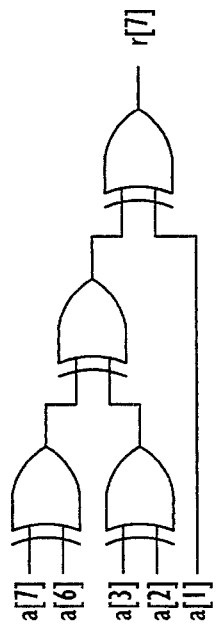
FIG. 14E  FIG. 14F  FIG. 14G  FIG. 14H
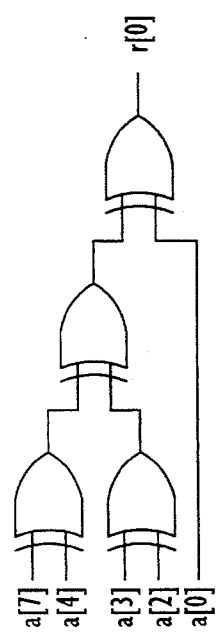
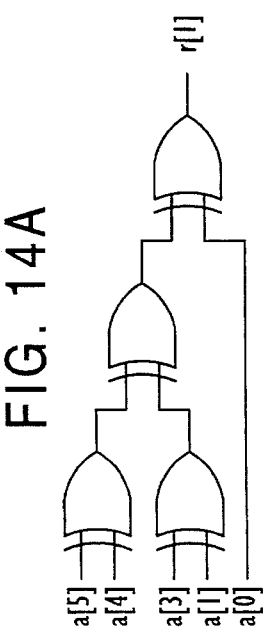
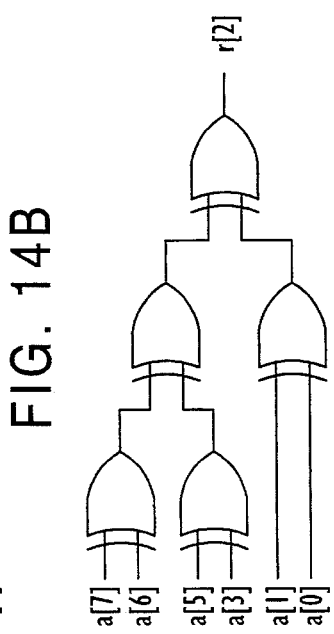
FIG. 14A  FIG. 14B  FIG. 14C  FIG. 14D

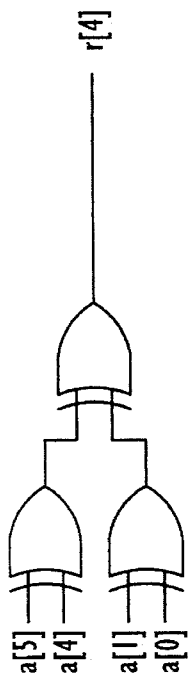
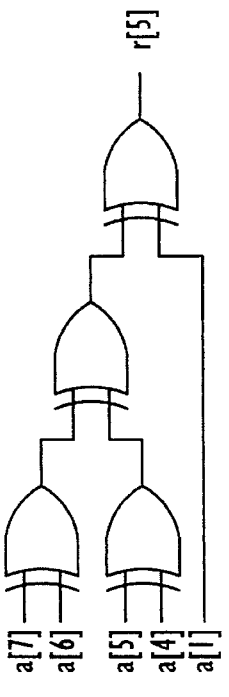
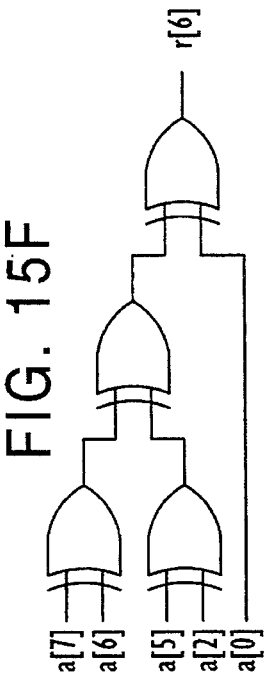
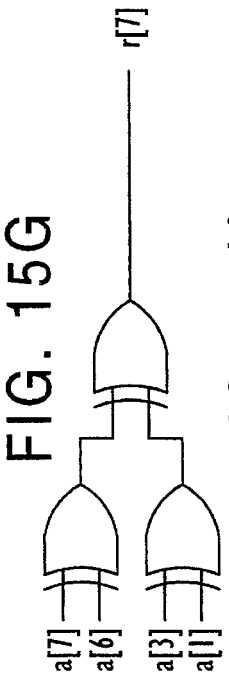
FIG. 15E  FIG. 15F  FIG. 15G  FIG. 15H
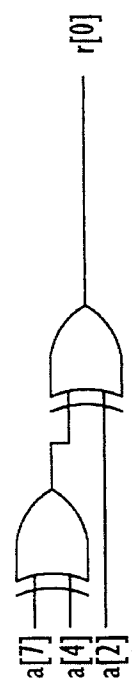
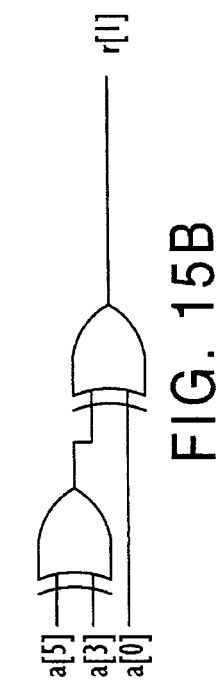
FIG. 15A  FIG. 15B  FIG. 15C  FIG. 15D

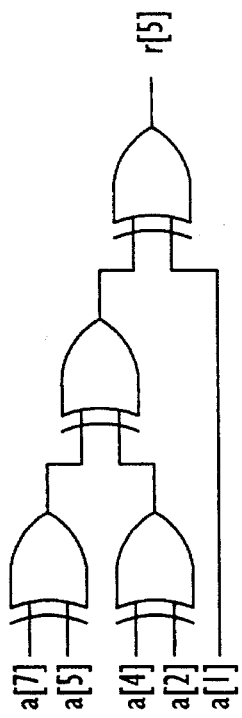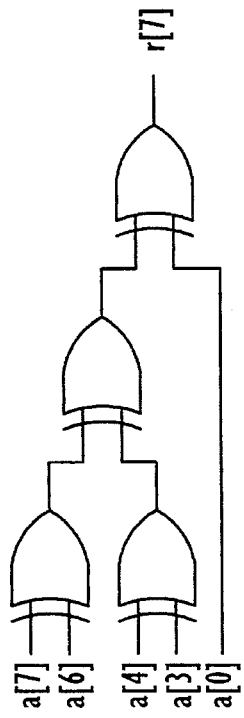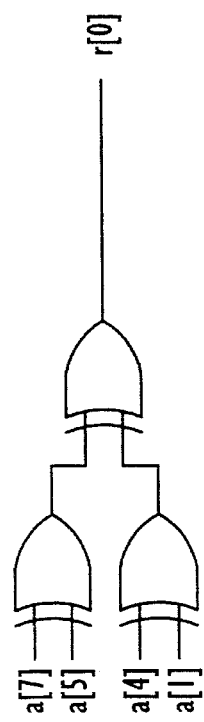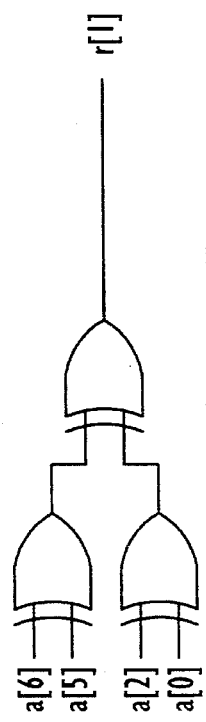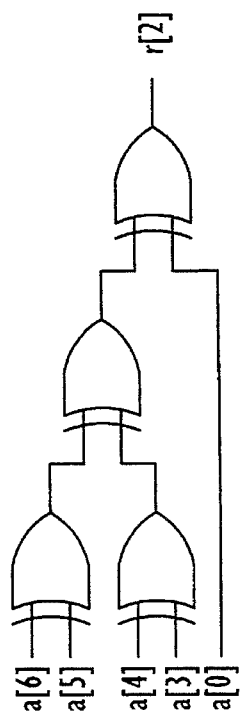
FIG. 17A  FIG. 17B  FIG. 17C  FIG. 17D  FIG. 17E  FIG. 17F  FIG. 17G  FIG. 17H

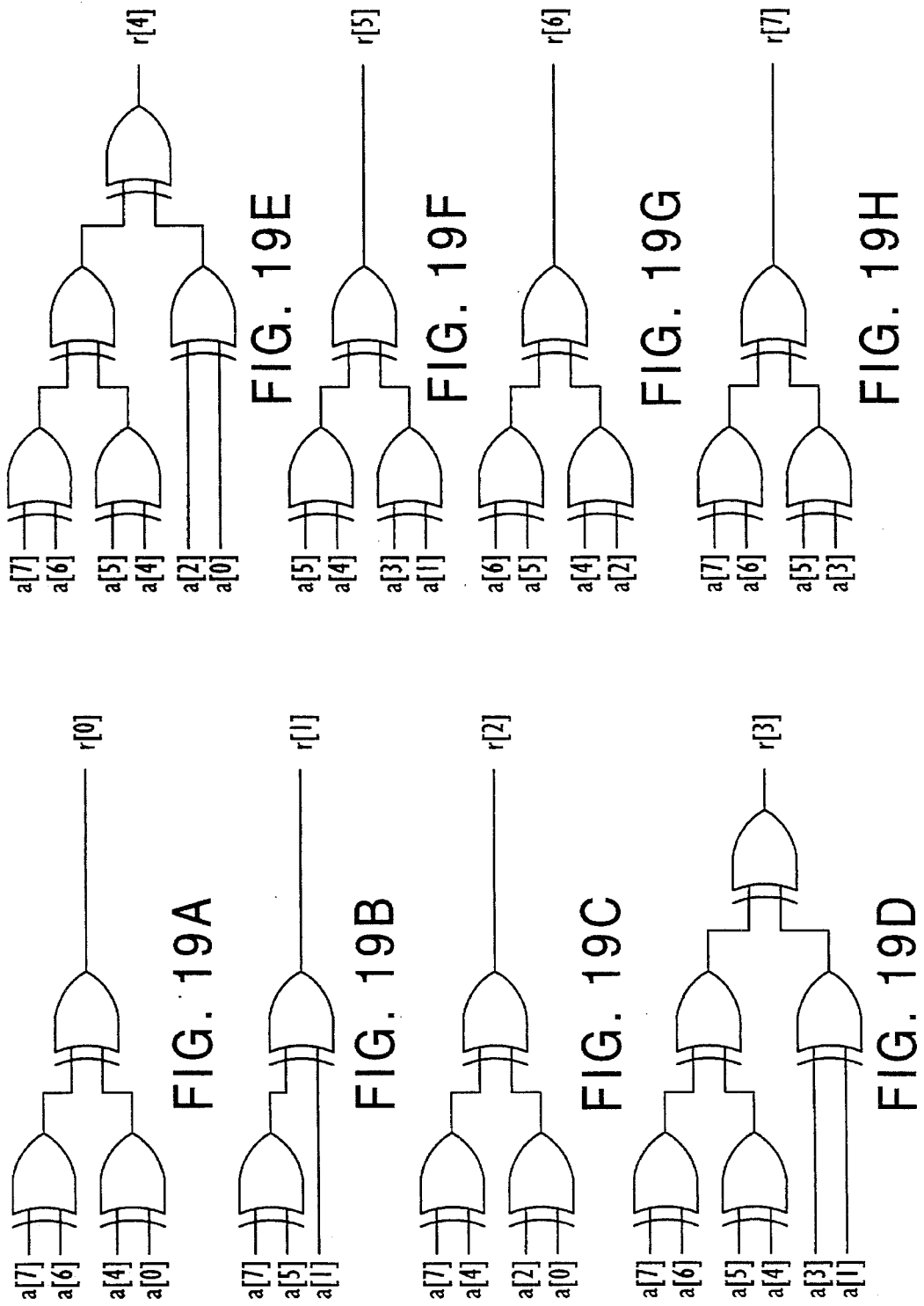

METHOD AND APPARATUS FOR DETERMINING ERROR LOCATION

TECHNICAL FIELD

This invention relates generally to error correction, and more particularly to a method of and apparatus for determining location of errors that occur during data storage.

BACKGROUND ART

Since a storage medium is subject to various types of noise, distortion and interference, various errors can occur at the output of the storage medium. The massive amount of digital data stored in an optical disk storage increases the probability of the errors. To correct the errors, error control coding is used. Reference is now made to FIG. 1, wherein an error correction system comprises an encoder 22, which transforms an input information sequence entered on the optical disk storage into code words.

In optical disk applications the code words are encoded based on International Standard Organization (ISO) Standard that requires Cyclic Redundancy Check (CRC) encoding and incorporates a Reed-Solomon (RS) code over some Galois fields. The RS (n,k) code is a cyclic symbol error-correcting code where k symbols of an original data are encoded. The result, which is an (n-k)-symbol redundancy block, is appended to the data.

The Galois field is a finite field, the elements of which may be represented as polynomials with a particular primitive element as variables. The RS code represents a block sequence of a Galois field $GF(2^m)$ of $2^m$ binary symbols, where m is the number of bits per symbol. Constructing the Galois field $GF(2^m)$ requires a generator polynomial $p(x)$ of degree m and a primitive element $\beta$, which is a root of $p(x)$. The powers of $\beta$ generate all nonzero elements of $GF(2^m)$. Encoding and decoding circuitry is therefore required which has a capability of performing Galois field arithmetic.

The encoder 22 generates, in k steps, (n-k) redundancy bytes, which are appended to the original code data to make a n-byte code word. A writing unit 24 records the coded data on an optical disk 26.

A reading unit 28 unloads data from the optical disk 26 and transfers them to a decoding section 30. The decoding section 30 comprises a syndrome generator 32, which detects errors and generates syndrome bytes S(x) for each word received from the optical disk. The syndrome (n-k) bytes are supplied to an Euclidean operation circuit 34, which finds an error location polynomial $\alpha(x)$ and error value polynomial $\eta(x)$ using an extended Euclidean algorithm. The Euclidean operation circuit 34 is connected to an error locating circuit 36, which uses the Chien Search process to find actual error locations based on the error location polynomial $\sigma(x)$. The error locations together with the error value polynomial $\eta(x)$ and error location polynomial $\sigma(x)$ are used by an error value calculator 38 to determine error value at each error location found by the Chien Search process. An error correcting circuit 40 uses known error locations and values to correct the errors. Thus, the error locating circuit determines the location of the errors within each word using the Chien Search process. This search tests each possible error position suggested by the error location polynomial $\sigma(x)$ to establish the error location.

For error correction circuitry capable of correcting a maximum of 8 bytes for every 120 byte code word, used in an optical disk storage, a shortened RS (120, 104) code over the Galois field $GF(2^8)$ is required. This field consists of 256 vectors which represent every number between and including 0 to 255. These vectors are referenced using a specific element $\alpha^i$, where i=0, 1, . . . , 255. In order to generate $GF(2^8)$, a generator polynomial $p(x)$ of degree 8 and a primitive element $\beta^j$ are required. The primitive element $\beta^j$ can be used to generate another field by the same polynomial. The j represents a number coprime to $2^m-1$ for $GF(2^m)$, i.e. a number which is not divisible by $2^m-1$ or any of its factors. For $GF(2^8)$, there are 128 different primitive elements $\beta^j$, which can be used to generate various fields from each particular generator polynomial.

Therefore, for locating errors, the error location polynomial of degree 8 is used $$\alpha(x) = r_0 + r_1 \cdot x + r_2 \cdot x^2 + \ldots + r_8 \cdot x^8 \tag{1}$$

where $r_0$–$r_8$ are the coefficients of the location polynomial determined by the Euclidean operation circuit 34, and $x=\alpha^i$. The variable i is dependent upon the number of bytes per word (possible error locations) and the size of the Galois field. A set of unary multipliers and registers is used to check consecutively each byte in the codeword for a possible error location. Each of the unary multipliers consists of a plurality of Exclusive-OR. (XOR) gates. The number of the XOR gates is directly related to the number of test patterns required to acquire a reasonable fault coverage. Reduction of the number of test patterns would allow the error locating circuit to decrease the testing tine. This decrease would cause the processing speed of the error correction system to be increased. Also, reduction of the number of the XOR gates would allow the area of an error correction chip occupied by an error locating circuit to be decreased. Moreover, these unary multipliers which consist of a plurality of XOR gates are used in a plurality of modules in an error correction system. By applying the set of XORs, which is already implemented in another portion of the chip, the regularity of the IC design process would be improved.

In view of the above, it would be desirable to provide a circuit for locating errors in optical disks, wherein the fewest number of the XOR gates could be used. It would also be desirable to provide a circuit for locating errors in optical disks, which uses the same set of XORs as another module the error correction system.

DISCLOSURE OF THE INVENTION

Accordingly, one advantage of the invention is in reducing the time a circuit for location errors in optical disks requires for testing possible error locations.

Another advantage of the invention is in reducing the area of an error correction chip occupied by a circuit for locating errors in optical disks.

A further advantage of the invention is in providing a circuit for locating errors, which uses the same set of XOR gates as another module of an error correction system.

The above and other advantages of the invention are achieved, at least in part, by providing a means for testing possible positions of errors with a set of unary multipliers for multiplying by a set of Galois field elements $\alpha^k$ where k=123–131. An input means introduces a plurality of component signals representing possible positions of the errors. For example, the input means may introduce an error location polynomial formed by an Euclidean operation circuit. The testing means checks the plurality of component signals to find locations of the errors using multiplication by $\alpha^k$, where k=123–131.

In accordance with a preferred embodiment of the invention, the testing means comprises a plurality of multiplier accumulating means including accumulating registers responsive to the set of unary multipliers for storing output signals of the multipliers. Checksum means combines the accumulated signals, which are compared by comparison means with a predetermined value.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIGS. 4(A–H)–12(A–H) show unary multipliers for multiplying by a Galois field element $\alpha^k$ according to the preferred embodiment of the present invention FIGS. 13(A–H)–20(A–H) show typical unary multipliers for $\alpha^k$ used in an error locating circuit.

BEST NODE FOR CARRYING OUT THE INVENTION

Figure 1:
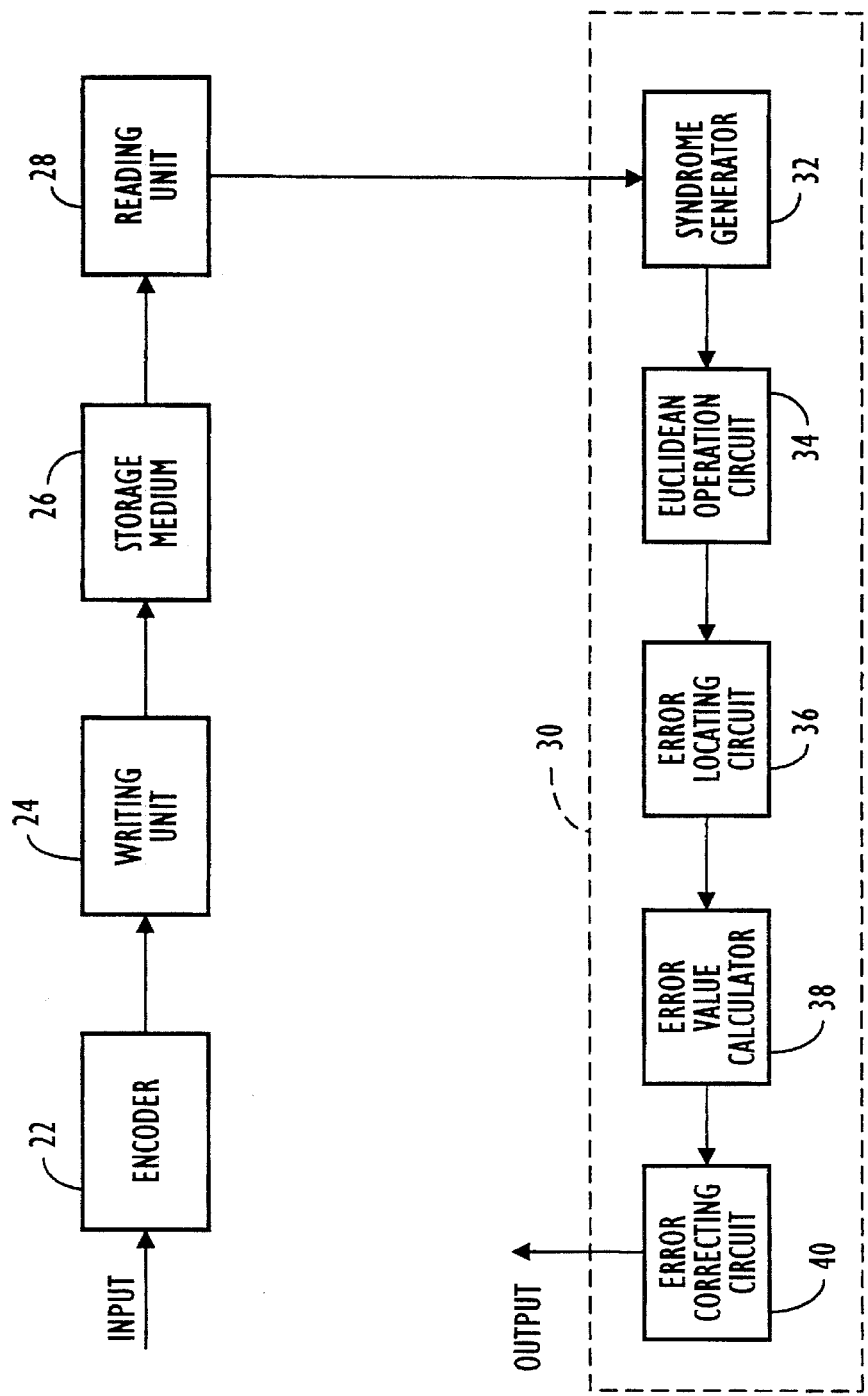
FIG. 1 is a block-diagram of a prior art system for correcting errors in an optical disk storage.

The best mode practicing the invention is based on the realization that for error correction circuitry capable of correcting a maximum of 8 bytes for every 120 byte code word, used in optical disk storage, a shortened Reed-Solomon RS (120, 104) code over the Galois field GF($2^8$) is required. As indicated above, the error location polynomial of degree 8

$$\alpha(x) = r_0 + r_1 \cdot x + r_2 x^2 + \ldots + r_8 \cdot x^8 \qquad (1)$$

formed by an Euclidean operation circuit allows up to 8 errors to be corrected. The variable $x = \alpha^i$, where $\alpha^i$ is an element of the Galois field GF($2^8$), where $i = 0, 1, \ldots, 255$. The 120-byte word to be corrected represents 120 possible error locations. At the start of each word $x = \alpha^{136}$. Then, to check each of the consecutive 119 bytes, the degree of $\alpha$ is increased by one.

Accordingly, error location polynomial $$\alpha(\alpha^{136}) = r_0 + r_1 \cdot \alpha^{136} + r_2 \cdot \alpha^{136.2} + \ldots + r_8 \cdot \alpha^{136.8} \qquad (2)$$

represents location 0, error location polynomial $$\alpha(\alpha^{137}) = r_0 + r_1 \cdot \alpha^{137} + r_2 \cdot \alpha^{137.2} + \ldots + r_8 \cdot \alpha^{137.8} = r_0 + r_1 \cdot \alpha^{136} \cdot \alpha^1 + r_2 \cdot \alpha^{136.2} \cdot \alpha^2 + \ldots + r^8 \cdot \alpha^{136.8} \cdot \alpha^8 \qquad (3)$$

represents location 1, etc. The last possible error location 119 is represented by error location polynomial $\alpha(\alpha^{255})$. In the case of $\alpha(\alpha^i) = 0$, the corresponding location is considered to be position of error.

Figure 2:
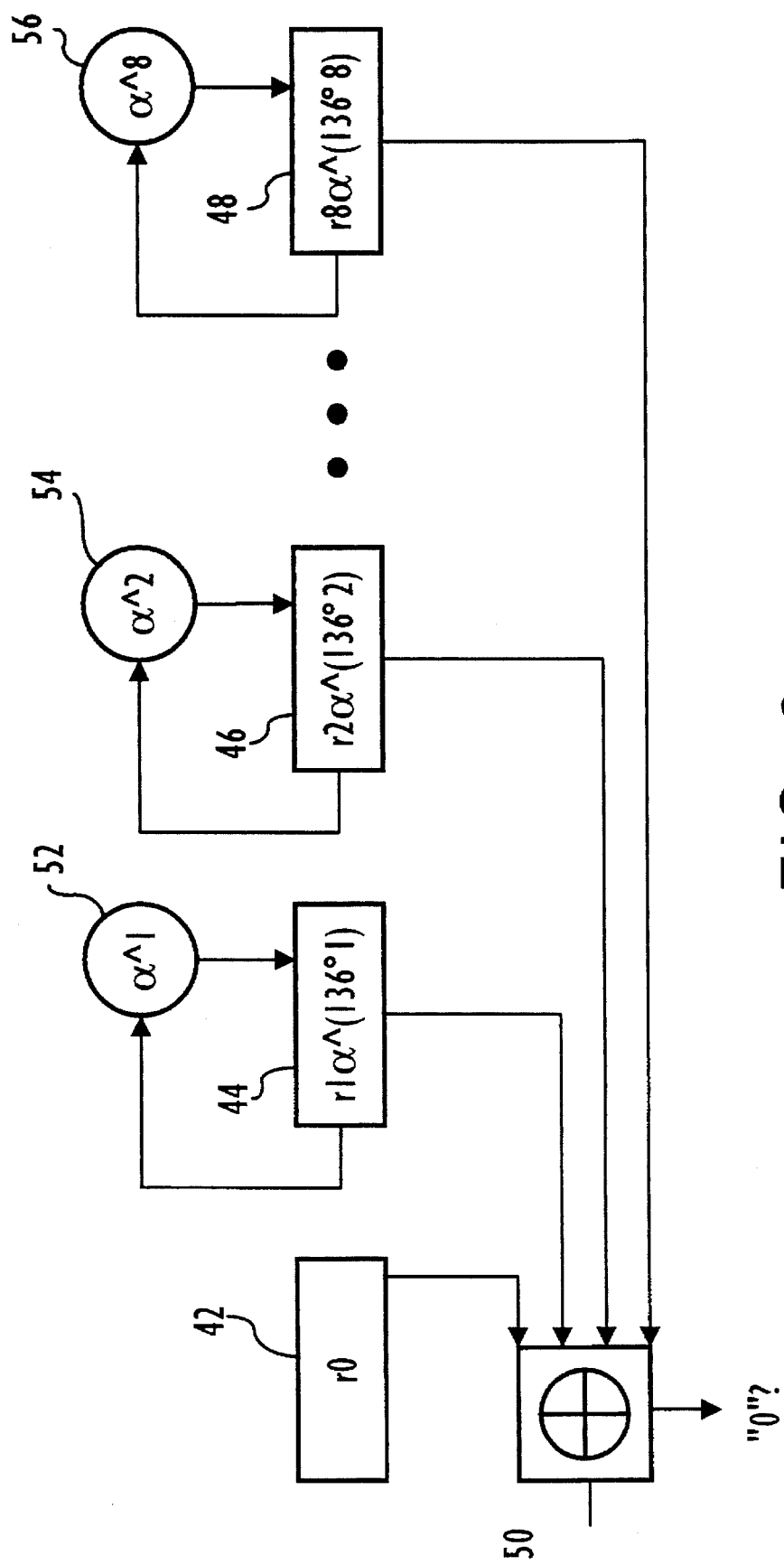
FIG. 2 is a simplified diagram of an error locating circuit.

Reference is now made to FIG. 2 of the drawings showing a simplified diagram of a circuit for testing possible error locations. Units 42–48 of the testing circuit are registers, which store terms of the error location polynomial formed by the Euclidean operation circuit. A first term stored in the register 42 is constant since it contains only coefficient $r_0$. The register 44 contains a second term $r_1 \cdot x$, which is equal to $r_1 \cdot \alpha^{136}$ at the start of each word. The register 46 stores a third term $r_2 \cdot x^2$ equal to $r_2 \cdot \alpha^{136.2}$ etc. The last register 48 contains a ninth term $r_8 \cdot x^8$, which is equal to $r_8 \cdot \alpha^{136.8}$ at the start of each word. To test location 0 of 120-byte word to be corrected, the values stored in registers 42–48 are combined by an XOR checksum circuit 50. If the result of the XOR is zero, the location 0 is considered to be location of an error.

To test location 1, the values of the registers 44–48 are respectively multiplied by signals corresponding to $\alpha^1 - \alpha^8$. This multiplication is performed by a set of unary multipliers 52–56, each of which together with the corresponding one of the accumulating registers 44–48 forms a multiplier accumulating circuit. An external clock signal causes the values of the unary multipliers 52–56 to be saved in the accumulating registers 44–48 in order to form a new error location polynomial $\alpha(\alpha^{137})$. The checksum circuit 50 performs XOR operation under the updated values of the registers 44–48 to determine whether the result of the XOR is zero or not. If zero is determined, the location 1 is considered to be a location of an error.

Similarly, each of the remaining locations 2–119 is tested under control of consecutive clock signals.

In the case of $\alpha(\alpha^i) = 0$, the fact of $\alpha^i$ being a root of this equation will not be altered by multiplying a constant $(\alpha^i)^j$ to it. This property can be shown as follows:

If $$\sigma(\alpha^i) = r_0 + r_1 \cdot \alpha^i + r_2 \cdot \alpha^{2i} + \ldots + r_8 \cdot \alpha 8i = 0$$

then $$(\alpha^i)^j \sigma(\alpha^i) = (\alpha^i)^j \cdot (r_0 + r_1 \alpha + r_2 \cdot \alpha^{2i} + \ldots + r_8 \cdot \alpha^{8i}) = 0. \qquad (4)$$

It makes it possible to modify a set of the unary multipliers of the circuit shown in FIG. 2. In the preferred embodiment of the invention, $(\alpha^i)^j$ is chosen such that $j = 123$.

Figure 3:
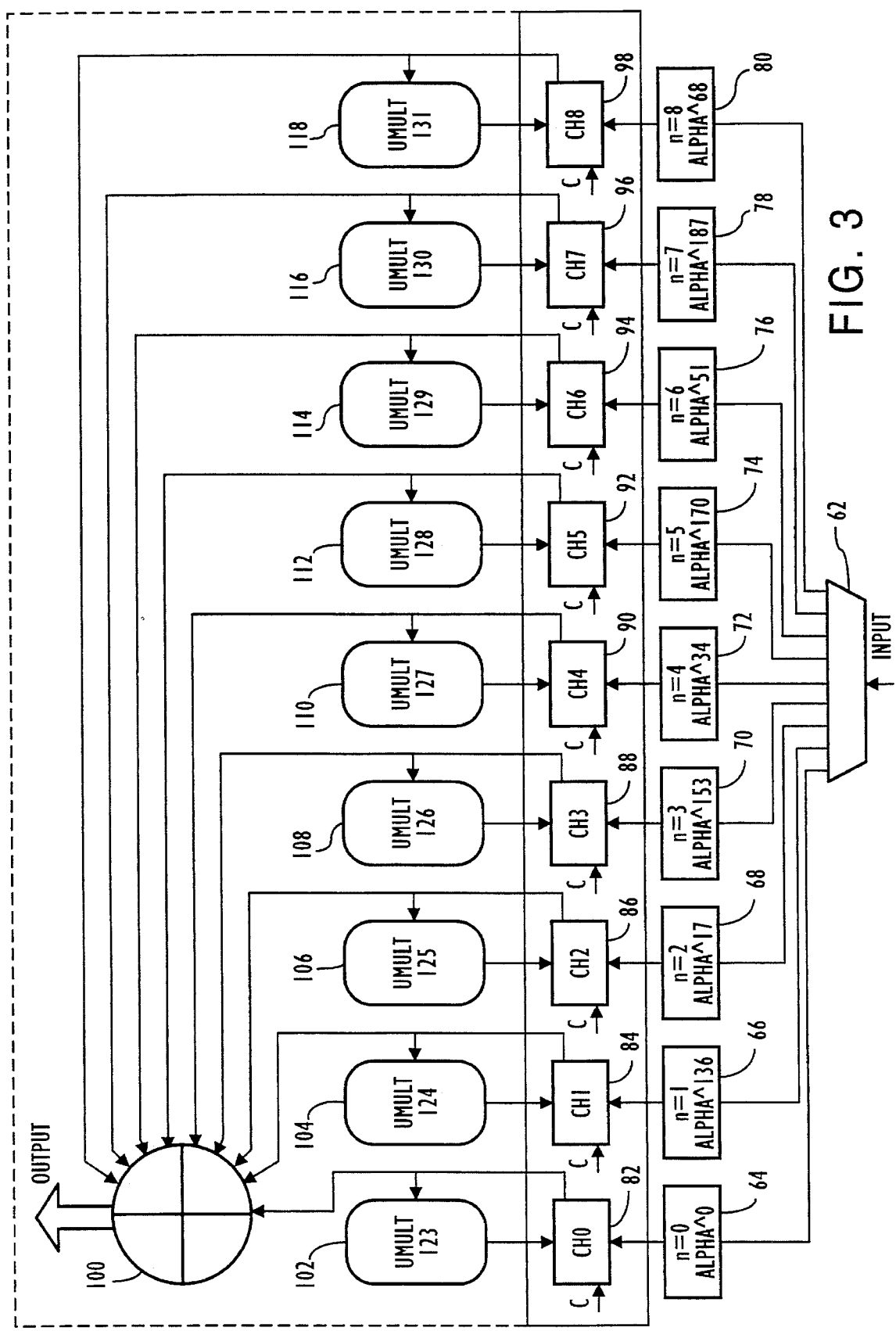
FIG. 3 diagram showing an error locating circuit of a system for correcting errors according to the preferred embodiment of the present invention.
Figure 12G:
Figure 16E:
Figure 16F:
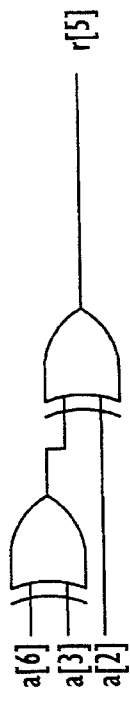
Figure 16G:
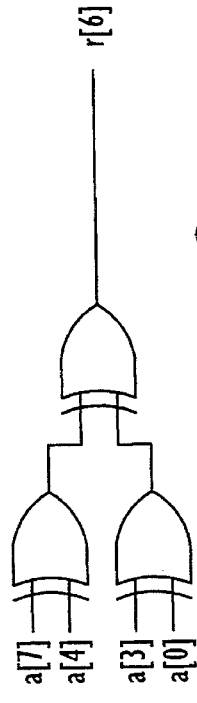
Figure 16H:
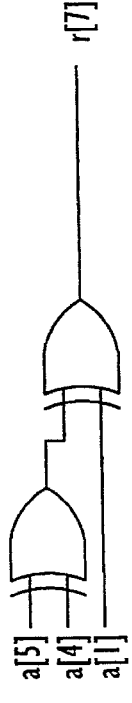
Figure 16A:
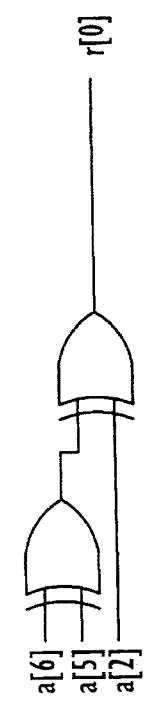
Figure 16B:
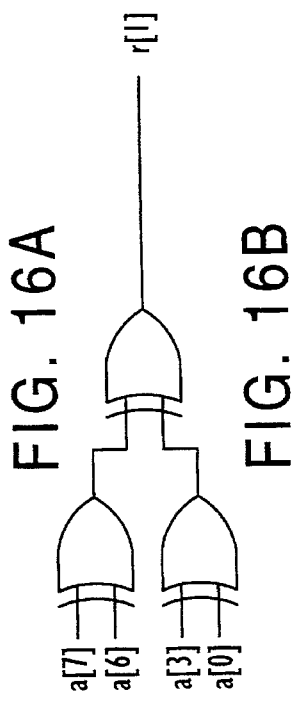
Figure 15C:
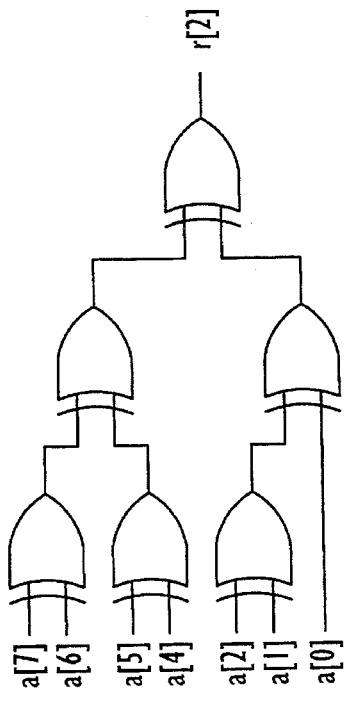
Figure 16D:
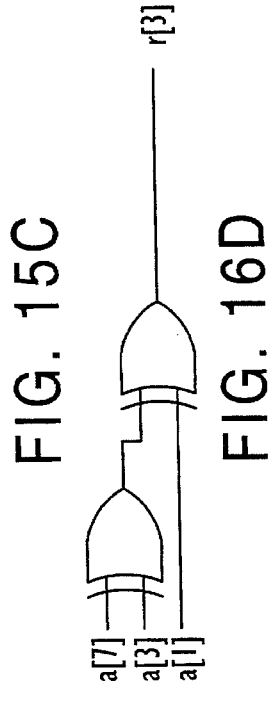
Figure 18E:
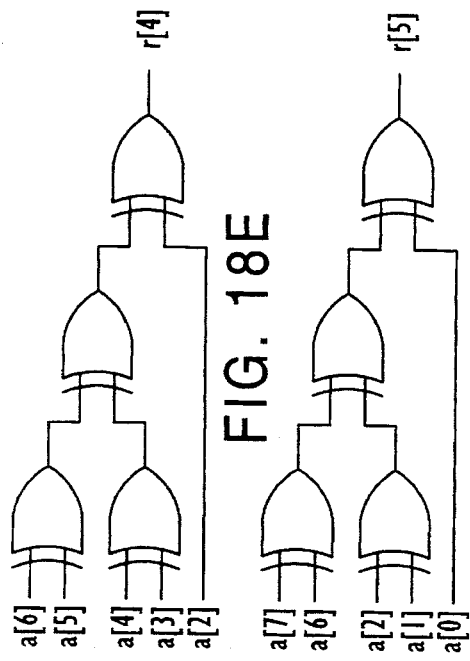
Figure 18F:
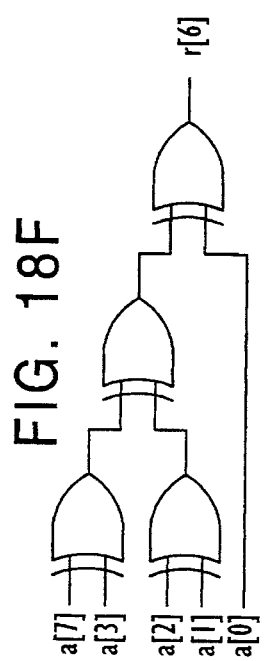
Figures 18G, 18H:
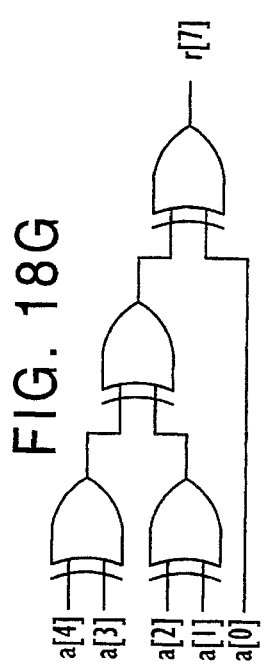
Figure 18A:
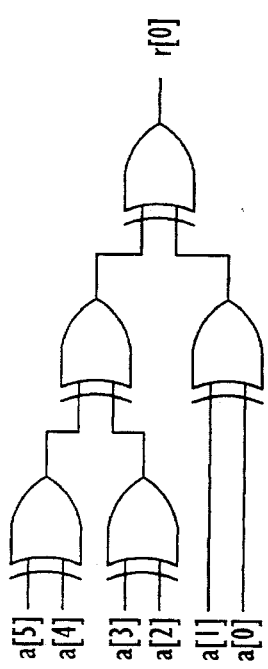
Figures 18B, 18C:
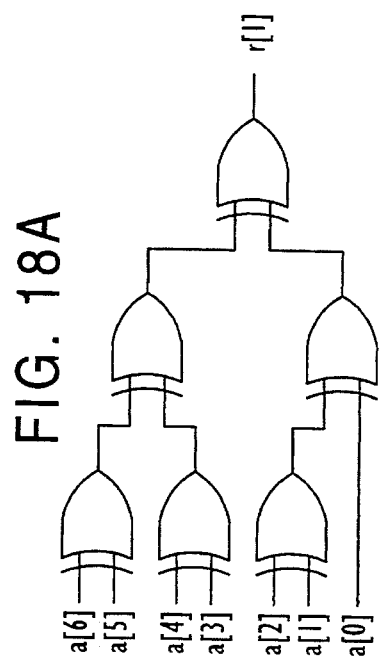
Figure 18D:
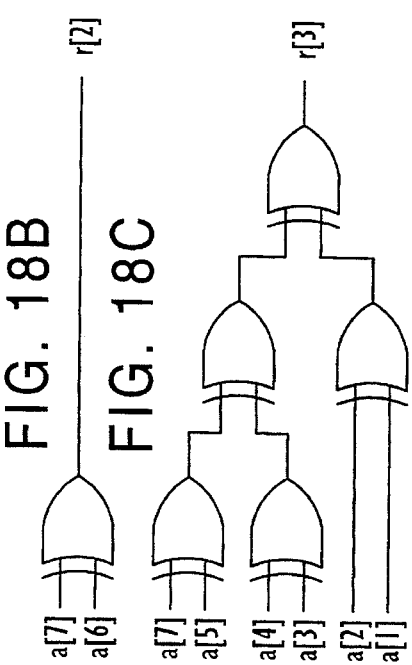
Figure 20E:
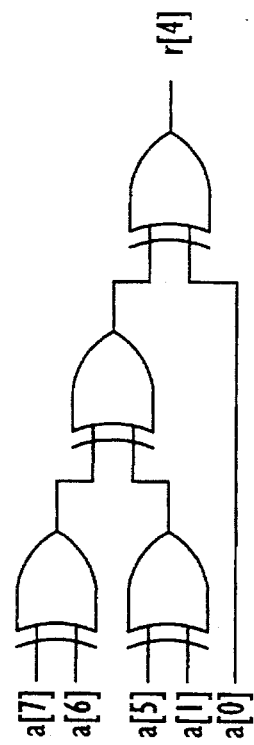
Figure 20F:
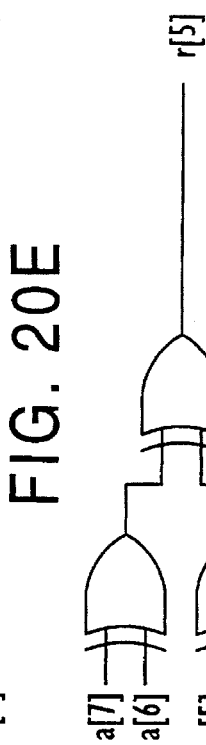
Figure 20G:
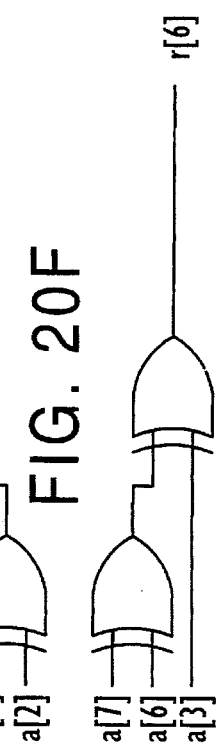
Figure 20H:
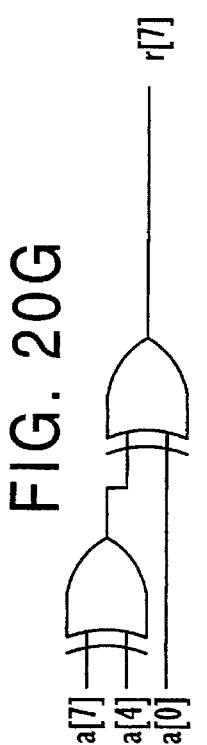
Figure 20A:
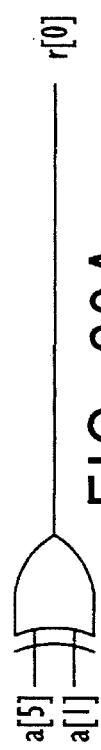
Figure 20B:
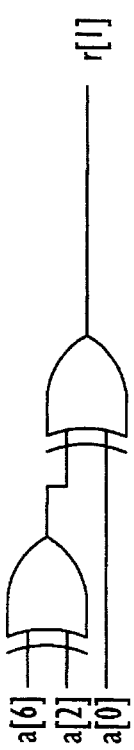
Figure 20C:
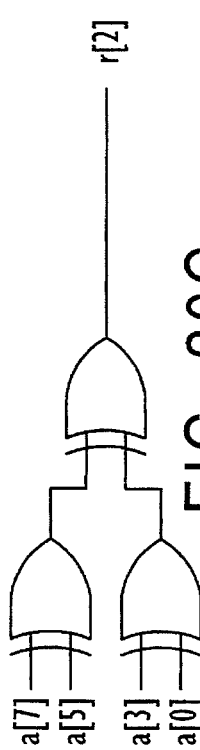
Figure 20D:
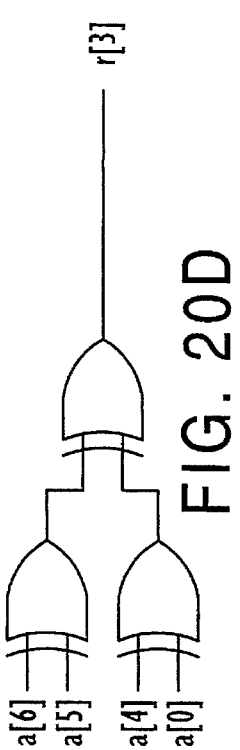

Reference is now made to FIG. 3 of the drawings showing an error locating circuit of a system for correcting errors according to the preferred embodiment of the present invention. An input register 62 loads nine buffer registers 64–80 with corresponding terms of an error location polynomial $\sigma(\alpha^i)$, where $i = 136$ at the start of each 120-byte word to be corrected. As the first term does not contain the variable $\alpha^i$, the register 64 is loaded with the constant coefficient $r_0$ of the error location polynomial ($n = 0$, $\alpha^0$). The register 66 contains the coefficient $r_1$ ($n = 1$) and the variable The register 68 stores the coefficient $r_2$ ($n = 2$) and the variable $\alpha^{17}$ equal to $\alpha^{136.2}$ over the Galois field GF($2^8$), which incorporates 255 255 elements. The register 70 contains the coefficient $r_3$ ($n = 3$) and the variable equal to $\alpha^{136.3}$ over the Galois field GF($2^8$). Similarly, the registers 72–80 respectively store the coefficients $r_{4-r_8}$ of the error location polynomial ($n = 4-8$) and the variables $\alpha^{34}$, $\alpha^{170}$, $\alpha^{51}$, $\alpha^{187}$ and $\alpha^{68}$, which are respectively equal to $\alpha^{136.4}$, $\alpha^{136.5}$, $\alpha^{136.6}$, $\alpha^{136.7}$ and $\alpha^{136.8}$ over the Galois field GF($2^8$).

The outputs of the buffer registers 64–80 are respectively connected to accumulating registers 82–98 (ch0–ch8), each of which together with the corresponding one of unary multipliers 102–108 forms a multiplier accumulating circuit. The accumulating registers 82–98 transfer corresponding terms of the error location polynomial to a checksum circuit 100 used for XORing the output signals of the registers 82–98. If the result of the XOR operation is zero, the first byte of the word to be corrected is considered to be a location of error.

As indicated above, the error location polynomial over the Galois field GF($2^8$) is used to find the location of up to 8 errors. To test the next possible error location or the next byte of the word to be corrected, an external counter applies a clock signal to the clock inputs C of the accumulating registers 82–98. It results in multiplying the contents of each of the registers 82–98 by a respective element of a set of Galois field elements $\alpha^{123}$–$\alpha^{131}$. The multiplication is performed by the unary multipliers 102–118 included in the feedback loop of the corresponding accumulating registers. The results of the multiplication from the outputs of the unary multipliers 102–118 are saved into the registers 82–98, which transfer them to the checksum circuit 100. The checksum circuit 100 performs XOR operation under the updated values of the registers 82–98 to determine whether the result of the XOR operation is zero or not. If the result is zero, the current count of the external counter is considered to correspond to an error location. The external counter provides 120 counts, which correspond to 120 possible error locations in 120-byte word to be corrected.

Reference is now made to FIGS. 4(A–H)–12(A–H) respectively showing the unary multipliers 102–118 (of FIG. 3) for multiplying by the Galois field elements $\alpha^{123}$–$\alpha^{131}$ in accordance with the preferred embodiment of the present invention. Each of the unary multipliers 102–118 (of FIG. 3) consists of XOR gates and operates under the elements of the field created by a primitive element $\beta^{88}$. FIGS. 4A–4H represent the corresponding outputs r[0:7] and inputs a[0:7] of the unary multiplier for $\alpha^{123}$. As shown in FIG. 4A, the output r[0] of this multiplier is provided by an output of an XOR gate having its inputs connected to the inputs a[4] and a[0] of the multiplier. The output r[1] shown in FIG. 4B is provided by an output of an XOR gate having its inputs connected through another XOR gate to the inputs a[5] and a[1] and directly to the input a[0]. The output r[2] represented in FIG. 4C is provided by an output of an XOR gate having its inputs connected through a pair of XOR gates to the inputs a[6], a[4], a[2] and a[1]. As shown in FIG. 4D, the output r[3] is provided by a combination of four XOR gates connected to the inputs a[7] and a[2:5]. FIG. 4E shows the output r[4] provided by a combination of four XOR gates connected to the inputs a[3:6] and a[0]. The output r[5] represented in FIG. 4F is provided by an output of an XOR gate having its inputs connected through a pair of XOR gates to the inputs a1] and a[5:7]. FIG. 4G shows the output r[6] provided by a pair of XOR gates connected to the inputs a[7], a[6] and a[2]. The last input r[7] shown in FIG. 4H is provided by an XOR gate coupled to the inputs a[7] and a[3].

FIGS. 5A–5H represent the corresponding outputs r[0:7] and inputs a[0:7] of the unary multiplier for $\alpha^{124}$. Each of the outputs r[0] and r[7] respectively shown in FIG. 5A and 5H is provided by a combination of five XOR gates. Each of the outputs r[1], r[2] and r[6] respectively represented in FIGS. 5B, 5C and 5G is provided by a combination of four XOR gates. As shown in FIG. 5F, the output r[5] is formed by three XOR gates. FIGS. 5D and 5E show that each of the outputs r[3] and r[4] is provided by a single XOR gate.

FIGS. 6A–6H represent the corresponding outputs r[0:7] and inputs a[0:7] of the unary multiplier for Each of the outputs r[0], r[5] and r[6] of this multiplier shown in FIGS. 6A, 6F and 6G is provided by a single XOR gate. As shown in FIG. 6C, the output r[2] is directly connected to the input a[5]. Each of the outputs r[1], r[3] and r[7] respectively shown in FIGS. 6B, 6D and 6H is provided by a pair of XOR gates. The output r[4] represented in FIG. 6E is formed by three XOR gates.

FIGS. 7A–7H represent the corresponding outputs r[0:7] and inputs a[0:7] of the unary multiplier for $\alpha^{126}$. Each of the outputs r[0], r[1] and r[5:7] is provided by a combination of four XOR gates and each of the outputs r[2], r[3] and r[4] is provided by three XOR gates.

FIGS. 8A–8H represent the corresponding outputs r[0:7] and inputs a[0:7] of the unary multiplier for $\alpha^{127}$. This multiplier uses four XOR gates for providing each of the outputs r[2] and r[4], three XOR gates for each of the outputs r[1], r[3] and r[5:7] and a pair of XOR gates for the output r[0].

FIGS. 9A–9H represent the corresponding outputs r[0:7] and inputs a[0:7] of the unary multiplier for $\alpha^{128}$. Four XOR gates is used to provide each of the outputs r[2:4], three XOR gates forms each of the outputs r[5] and r[6]. Each of the outputs-r[1] and r[7] are provided by a pair XOR gates, and the output r[0] uses a single XOR gate.

FIGS. 10A–10H represent the corresponding outputs r[0:7] and inputs a[0:7] of the unary multiplier for $\alpha^{129}$. This multiplier uses a single XOR gate for each of the outputs r[5] and r[6], a pair of XOR gates for the outputs r[0], r[2] and r[7], three XOR gates for the output r[1], and four XOR gates for each of the outputs r[3] and r[4].

FIGS. 11A–11H represent the corresponding outputs r[0:7] and inputs a[0:7] of the unary multiplier for $\alpha^{130}$. The unary multiplier uses a single XOR gate for each of the outputs r[0], r[3], r[4], r[6] and r[7], a pair of XOR gates for the output r[1] and four XOR gates for the output r[2]. The output r[5] is connected directly to the input a[2].

FIGS. 12A–12H represent the corresponding outputs r[0:7] and inputs a[0:7] of the unary multiplier for $\alpha^{131}$. Each of the outputs r[0], ri1 and r[7] of this multiplier is formed by a pair of XOR gates, each of the outputs r[3], r[4] and r[6] is provided by three XOR gates, and each of the outputs r[2] and r[5] uses four XOR gates.

Thus, a total number of the XOR gates required by the set of the unary multipliers for $\alpha^{123}$–$\alpha^{131}$ is equal to 189.

For comparison, FIGS. 13(A–H)–20(A–H) respectively show unary multipliers for multiplying by $\alpha^1$–$\alpha^8$, which are usually used to implement Chien search process for determining error locations. As can be seen, this set of unary multipliers requires 209 XOR gates.

The number of the XOR gates used in the unary multipliers of the error locating circuit determines the number of test patterns required to acquire a reasonable fault coverage. Reduction of the number of test patterns allows the error locating circuit to decrease testing time. This decrease causes the processing speed of the error correction system to be increased. Also, reduction of the number of the XOR gate allows a decrease in the area of an error correction chip occupied by an error locating circuit. Moreover, the set of unary multipliers $\alpha^{123}$–$\alpha^{131}$ is a subset of those used in the syndrome generator of the system for correcting errors shown in FIG. 1. By applying the set of XOR gates, which is already implemented in another portion of the chip, the regularity of the IC design process is improved.

There accordingly has been described a system for determining locations of errors that occur during data storage on optical disks. The presented system, which employs a set of unary multipliers for multiplying by elements of the Galois field $\alpha^{123}$–$\alpha^{131}$ allows the processing speed of the error correcting system to be increased and the area on the error correcting chip occupied by the error locating circuit to be decreased.

In this disclosure, there is shown and described only the preferred embodiment of the invention, but it is to be understood that the invention is capable of changes and modifications within the scope of the inventive concept as expressed herein.

We claim:

1. A circuit for determining locations of errors in an optical disk memory means comprising:

an input register for introducing a plurality of component signals representing possible positions of the errors, and a checking circuit for analyzing the plurality of component signals to find locations of the errors, said checking circuit comprising a plurality of circuits for multiplying each of the component signals by a respective element of a set of Galois field elements, said plurality of circuits consisting of multipliers by Galois field elements $\alpha^{123}$–$\alpha^{131}$ to reduce the number of XOR gates used in said plurality of circuits for multiplying.

2. The circuit of claim 1, wherein said checking circuit further comprises a plurality of accumulating registers responsive to said plurality of multiplying circuits for storing output signals of said multiplying circuit.

3. The circuit of claim 2, wherein said checking circuit further comprises a logic circuit responsive to said plurality of accumulating registers for forming a combined signal.

4. The circuit of claim 3, wherein said checking circuit further comprises a comparison circuit responsive to said logic circuit for comparing the combined signal with a predetermined value.

5. The circuit of claim 1, wherein said plurality of component signals comprises an error location polynomial.

6. A method of determining locations of errors in an optical disk memory means comprising the steps of:

introducing a plurality of component signals representing possible positions of the errors, and checking the plurality of component signals to find locations of the errors, said step of checking comprising multiplying each of the component signals by a respective element of a set of Galois field elements, said multiplying being performed using XOR gates only under Galois field elements $\alpha^{123}$–$\alpha^{131}$ to reduce the number of said XOR gates.

7. The method of claim 6, wherein said step of introducing comprises inputting an error location polynomial signal.

8. The method of claim 6, wherein said step of checking further comprises storing the multiplied component signals.

9. The method of claim 8, wherein said step of checking further comprises combining the stored signals.

10. The method of claim 9, wherein said step of checking further comprises comparing the combined signals with a signal of predetermined value.

11. Apparatus for determining locations of errors in an optical disk memory means comprising:

a syndrome generator for detecting the errors and generating syndrome bytes, an Euclidean operation circuit responsive to said syndrome bytes for finding an error location polynomial, error locating circuit responsive to said error location polynomial for finding locations of the errors, said syndrome generator comprising a first set of unary multipliers for multiplying by Galois field elements, said error locating circuit having a second set of unary multipliers consisting of a subset of said first set of unary multipliers.

12. The apparatus of claim 11, wherein said error locating circuit further comprises a plurality of accumulating means responsive to said plurality of multipliers for storing output signals of said multipliers.

13. The apparatus of claim 12, wherein said error locating circuit further comprises checksum means responsive to said plurality of accumulating means for forming a combined signal.

14. The apparatus of claim 13, wherein said error locating circuit further comprises a comparison means responsive to said checksum means for comparing the combined signal with a predetermined value.

15. The apparatus of claim 11, wherein said second set of unary multipliers consists of circuits for multiplying by Galois field elements $\alpha^{123}$–$\alpha^{131}$.

* * * * *